US012301099B2

(12) United States Patent
Stubbs et al.

(10) Patent No.: US 12,301,099 B2
(45) Date of Patent: May 13, 2025

(54) RC SNUBBER NETWORK

(71) Applicant: NEXPERIA B.V., Nijmegen (NL)

(72) Inventors: Ian Stubbs, Nijmegen (NL); Andy Berry, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 105 days.

(21) Appl. No.: 17/963,343

(22) Filed: Oct. 11, 2022

(65) Prior Publication Data
US 2023/0113625 A1 Apr. 13, 2023

(30) Foreign Application Priority Data
Oct. 8, 2021 (EP) .................................... 21201606

(51) Int. Cl.
*H02M 7/5387* (2007.01)
*H02M 1/34* (2007.01)

(52) U.S. Cl.
CPC ....... *H02M 1/346* (2021.05); *H02M 7/53871* (2013.01)

(58) Field of Classification Search
CPC ...... H02M 1/34; H02M 1/346; H02M 7/5387; H02M 7/53871
See application file for complete search history.

(56) References Cited

U.S. PATENT DOCUMENTS

| 8,643,071 B2 * | 2/2014 | Pan ..................... H01L 29/7813 257/302 |
| 2009/0242977 A1 | 10/2009 | Kawaguchi et al. |
| 2012/0175700 A1 | 7/2012 | Hsieh |
| 2013/0334599 A1 | 12/2013 | Pan et al. |
| 2016/0118380 A1 * | 4/2016 | Lui ....................... H01L 29/407 257/379 |

OTHER PUBLICATIONS

Extended European Search Report for corresponding European application EP21201606.7, 10 pages dated Mar. 21, 2022.

* cited by examiner

*Primary Examiner* — Adolf D Berhane
(74) *Attorney, Agent, or Firm* — Ruggiero McAllister & McMahon LLC

(57) ABSTRACT

The present disclosure relates to a switching device including a RC snubber network. The present disclosure further relates to a RC snubber network for a switching device. A switching device is provided that includes a trench transistor and an RC snubber network connected in between a first terminal and a second terminal of the trench transistor. The RC snubber network includes at least one current concentrating segment that is configured to locally force a major part of the snubber current passing through the trench capacitors to flow through a reduced number of trench capacitors to thereby increase the Ohmic losses associated with the snubber current.

18 Claims, 6 Drawing Sheets

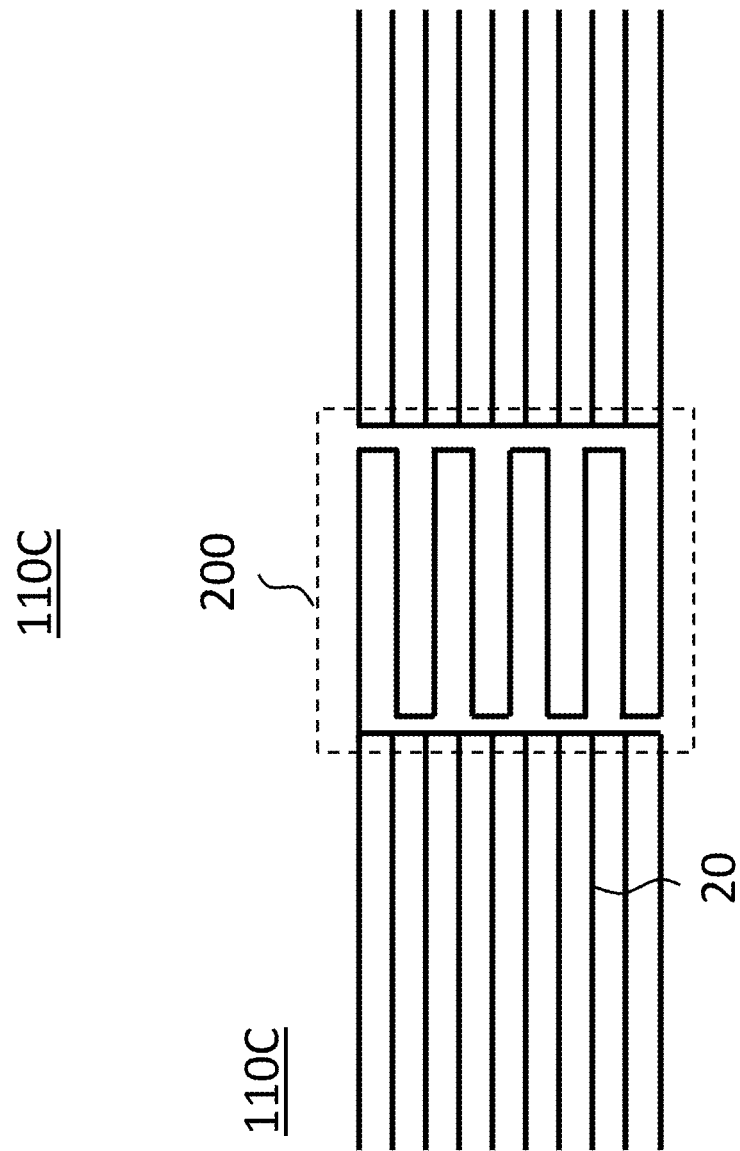

RC SNUBBER NETWORK

CROSS REFERENCE TO RELATED APPLICATION

This application claims the benefit under 35 U.S.C. § 119(a) of European Application No. 21201606.7 filed Oct. 8, 2021, the contents of which are incorporated by reference herein in their entirety.

BACKGROUND OF THE DISCLOSURE

1. Field of the Disclosure

The present disclosure relates to a switching device comprising an RC snubber network. The present disclosure further relates to an RC snubber network for a switching device.

2. Description of the Related Art

Switching devices such as metal-oxide-semiconductor field-effect transistors, MOSFETs, are capable of switching between a zero to low current off-state and a high current on-state. To prevent unwanted transients from occurring due to switching from the off-state to the on-state it is known to add an RC network between the drain and source contacts of the MOSFET. Such RC network is referred to as an RC snubber network.

For trench MOSFETs, the RC snubber networks are realized on the semiconductor die on which the trench MOSFET is integrated. Typically, the RC snubber network comprises a network of trench capacitors. These capacitors comprise an insulating layer covering an inner wall of a trench. On this insulating layer, a conductive track is arranged, typically in the form of a polysilicon body, which forms a first terminal of the capacitor. In addition, the semiconductor substrate itself is mostly conductive and functions as the second terminal of the capacitor.

Furthermore, the network of trench capacitors can be described as a ladder network comprising capacitors to ground and resistors in series.

To suppress unwanted ringing during switching it is important to appropriately design the RC snubber network. More in particular, in order to achieve suitable suppression of unwanted ringing, the resistance and capacitance of the RC snubber network should be optimized in tandem. In some practical situations, the area available for the RC snubber network is limited. In these cases, almost all available/remaining area is used for realizing capacitance.

A possible approach for realizing a given resistance in the RC snubber network is to employ thin film resistors. However, thin film resistors cannot be made with at least some of the available semiconductor manufacturing processes for realizing the trench MOSFETs. Known RC snubber networks realized in such processes therefore have the problem that if a given capacitance is realized as described above, the resistance of the RC snubber network is relatively fixed. Such combination of resistance and capacitance may not provide optimal performance.

SUMMARY

It is an object to provide a switching device having a RC snubber network in which the abovementioned problems do not occur or at least to a lesser extent.

According to a first aspect of the present disclosure, this object has been achieved with a switching device as defined in claim 1 that comprises a trench transistor, such as a trench MOSFET, integrated on a semiconductor substrate, wherein the trench transistor has a control terminal, a first terminal, and a second terminal, wherein the trench transistor is configured to control a current between the first and second terminals based on a control signal received at the control terminal. The switching device according to the present disclosure further comprises an RC snubber network that is integrated on the semiconductor substrate and that is electrically connected in between the first terminal and second terminal of the trench transistor, wherein the RC snubber network is configured to guide a snubber current during switching of the switching device, and wherein the RC snubber network comprises a network of trench capacitors.

The switching device according to the present disclosure is characterized in that the RC snubber network comprises at least one current concentrating segment that is configured to locally force a major part of the snubber current passing through the trench capacitors to flow through a reduced number of trench capacitors to thereby increase the Ohmic losses associated with the snubber current.

Known RC snubber networks comprise a network of trench capacitors arranged in parallel. In these networks, the snubber current is distributed over the trench capacitors. According to the present disclosure, such current is forced locally to flow through a reduced number of trench capacitors. This local concentration allows the same capacitance to be obtained albeit with a higher resistance. Put differently, the present disclosure allows the resistance to be optimized for a given capacitance.

Each trench capacitor may have a respective conductive track, for instance made of polysilicon, forming one terminal of that trench capacitor. The semiconductor substrate, which can be conductive or made partially conductive using vias or the like, may then form another terminal of that trench capacitor. Furthermore, the current concentrating segment may comprise a fan-in segment connected on one side thereof to the conductive tracks of M trench capacitors and on another side thereof to the conductive tracks of T trench capacitors. Additionally or alternatively, the current concentrating segment may comprise a fan-out segment connected on one side thereof to the conductive tracks of N trench capacitors and on another side thereof to the conductive tracks of the T trench capacitors. In the configurations above, T<M, T<N, and T>=1. Moreover, the fan-in segment may comprise a first trench capacitor among the network of trench capacitors of which the conductive track connects the conductive tracks of the M trench capacitors to the conductive tracks of the T trench capacitors. Additionally or alternatively, the fan-out segment may comprise a second trench capacitor among the network of trench capacitors of which the conductive track connects the conductive tracks of the N trench capacitors to the conductive tracks of the T trench capacitors. The trenches of the M trench capacitors can be connected to the trench(es) of the T trench capacitors through the trench of the first trench capacitor, and the trenches of the N trench capacitors can be connected to the trench(es) of the T trench capacitors through the trench of the second trench capacitor, thereby forming a contiguous trench. Alternatively, the fan-in segment and/or fan-out segment may each comprise a conductive track separate from a trench capacitor, e.g. a connecting bar or the like.

The trenches of the M trench capacitors and the trenches of the N trench capacitors may extend in a same direction. More in particular, the trenches of the M trench capacitors, the trenches of the N trench capacitors, and the trenches of the T trench capacitor(s) may extend in said same direction.

The trenches of the T trench capacitor(s) may have a meandering shape. The meandering shape may comprise a plurality of interconnected parallel segments. These segments may be elongated in the same direction as the trenches of the M and N trench capacitors. In this manner, by varying the distance between adjacent segments of the meandering shape, it becomes possible to vary the resistance of the current concentrating segment without significantly altering its length.

The network of trench capacitors may have an elongated shape, preferably in the aforementioned same direction, from a first end to a second end, wherein at least the trench capacitors in the network of trench capacitors other than the trench capacitors of the current concentrating segment preferably extend in this same direction. Furthermore, at least the trench capacitors in the network of trench capacitors other than the trench capacitors of the current concentrating segment can be equidistantly arranged.

The semiconductor substrate may have frontside and a backside, wherein the trench transistor is integrated on the semiconductor substrate at the frontside thereof. Furthermore, the trench transistor may have a frontside terminal and a backside terminal arranged at the frontside and backside of the semiconductor substrate, respectively, wherein one of the frontside terminal and backside terminal forms the first terminal of the trench transistor and wherein the other of the frontside terminal and backside terminal forms the second terminal of the trench transistor. The trench transistor typically comprises a further frontside terminal or further backside terminal that forms the control terminal of the trench transistor. This further frontside terminal or further backside terminal is preferably arranged on the same side of the semiconductor substrate as the second terminal of the trench transistor.

The frontside terminal can be formed by a conductive layer or plate, wherein the conductive layer or plate is typically formed using one or more layers of a metal layer stack.

The RC snubber network may further comprise a plurality of contacts that each connect a respective conductive track to the frontside terminal for connecting the RC snubber network to the frontside terminal. The at least one current concentrating segment may comprise a first current concentrating segment arranged closer to the first end than to the second end. The contacts for contacting the conductive tracks of the trench capacitors are preferably arranged in between the first end and the first current concentrating element. In this manner, the effect of the current concentrating segment on the resistance value of the RC snubber network is maximized.

The at least one current concentrating segment may comprise a second current concentrating segment arranged closer to the second end than to the first end, and the contacts for contacting the conductive tracks of the trench capacitors can be arranged in between the second end and the second current concentrating element.

The network of trench capacitors may comprise a plurality of segments that are adjacently arranged in a direction perpendicular to the aforementioned same direction, wherein each segment comprises one or more of said current concentrating segments.

The trench transistor can be formed using one or more trench etching steps, wherein the trenches of the RC snubber network have been formed using at least one of said one or more trench etching steps. For example, trench MOSFETs are generally formed using one or two trench etching steps. During one of these steps, the trenches of the RC snubber network can be formed. Alternatively, the trenches of the RC snubber network and the trenches of the trench transistor can be formed using separate processes. Similarly, the conductive tracks of the trench capacitors can be formed simultaneously with the conductive tracks or bodies that are arranged on the gate oxide of the trench MOSFETs. Alternatively, the conductive tracks of the trench capacitors can be formed in a separate process.

The semiconductor substrate can be a silicon substrate, and each trench capacitor may comprise a trench formed in the silicon substrate. An inside of the trenches can be covered by an insulating layer, and the trench capacitor may further comprise a conductive layer arranged on the insulating layer. The conductive layer can be electrically connected to and/or at least partially form the conductive track of that trench capacitor.

The insulating layer can be silicon dioxide and/or silicon nitride, and/or the conductive layer can be made from polysilicon, and/or the semiconductor substrate can be conductive.

According to a second aspect, the present disclosure provides an RC snubber network for a switching device as described above. This switching device comprises a trench transistor, such as a trench MOSFET, integrated on a semiconductor substrate, wherein the trench transistor has a control terminal, a first terminal, and a second terminal. Furthermore, the trench transistor is configured to control a current between the first and second terminals based on a control signal received at the control terminal.

According to the second aspect, the RC snubber network is integrated on the semiconductor substrate and is electrically connected in between the first terminal and the second terminal of the trench transistor. Moreover, the RC snubber network is configured to guide a snubber current during switching of the switching device, and comprises a network of trench capacitors.

According to the second aspect, the RC snubber network is characterized in that it comprises a current concentrating segment that is configured to locally force a major part of the snubber current passing through the trench capacitors to flow through a reduced number of trench capacitors to thereby increase the Ohmic losses associated with the snubber current.

Furthermore, the RC snubber network according to the second aspect of the present disclosure can be configured as the RC snubber network according to the first aspect of the present disclosure.

BRIEF DESCRIPTION OF THE DRAWINGS

Next, the present disclosure is described in more detail referring to the appended drawings, wherein:

FIGS. 3A, 3B and 3C illustrate examples of RC snubber networks in accordance with the present disclosure.

DETAILED DESCRIPTION

Figure 1:
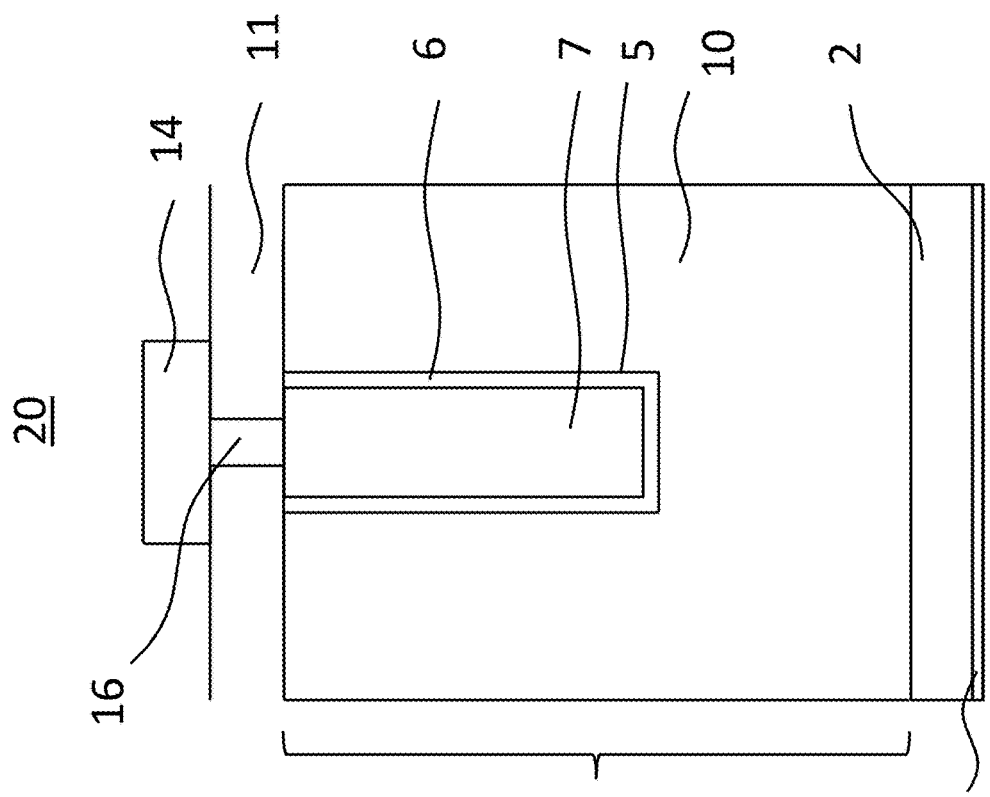
FIG. 1 illustrates an example of a known trench MOSFET and a known trench capacitor.
Figure 1:
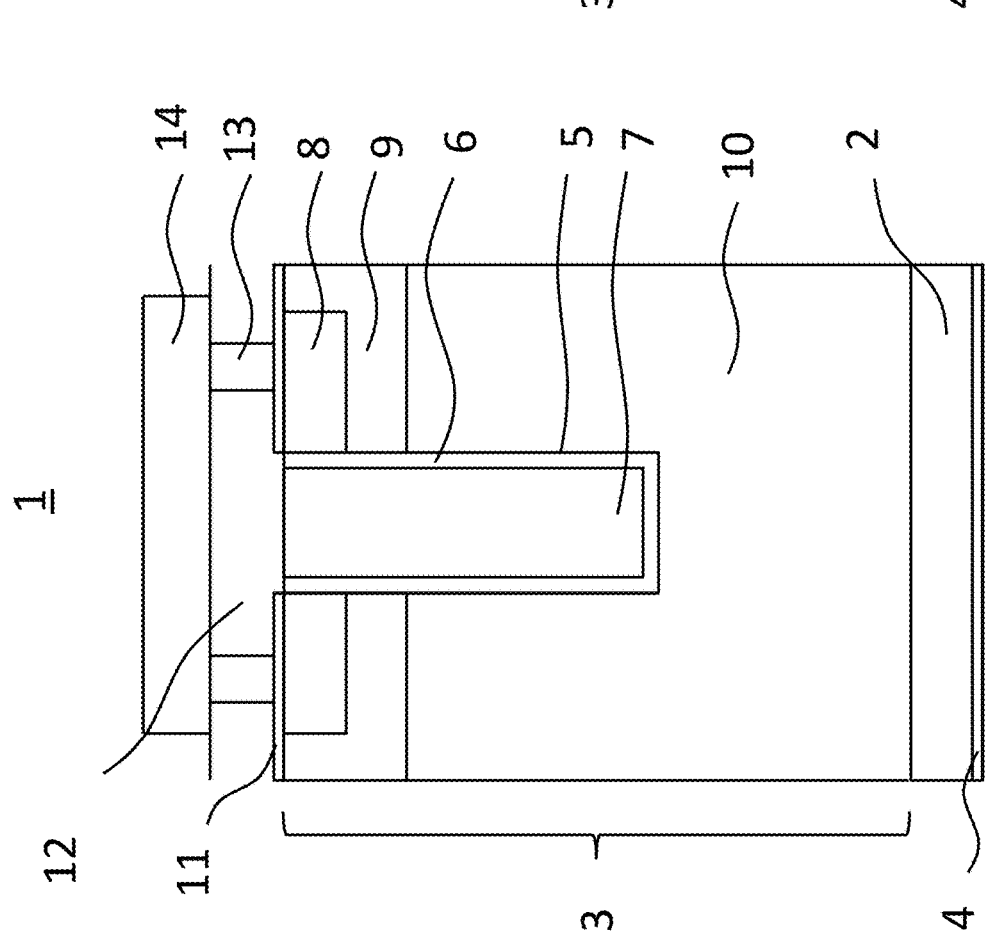
Figure 2:
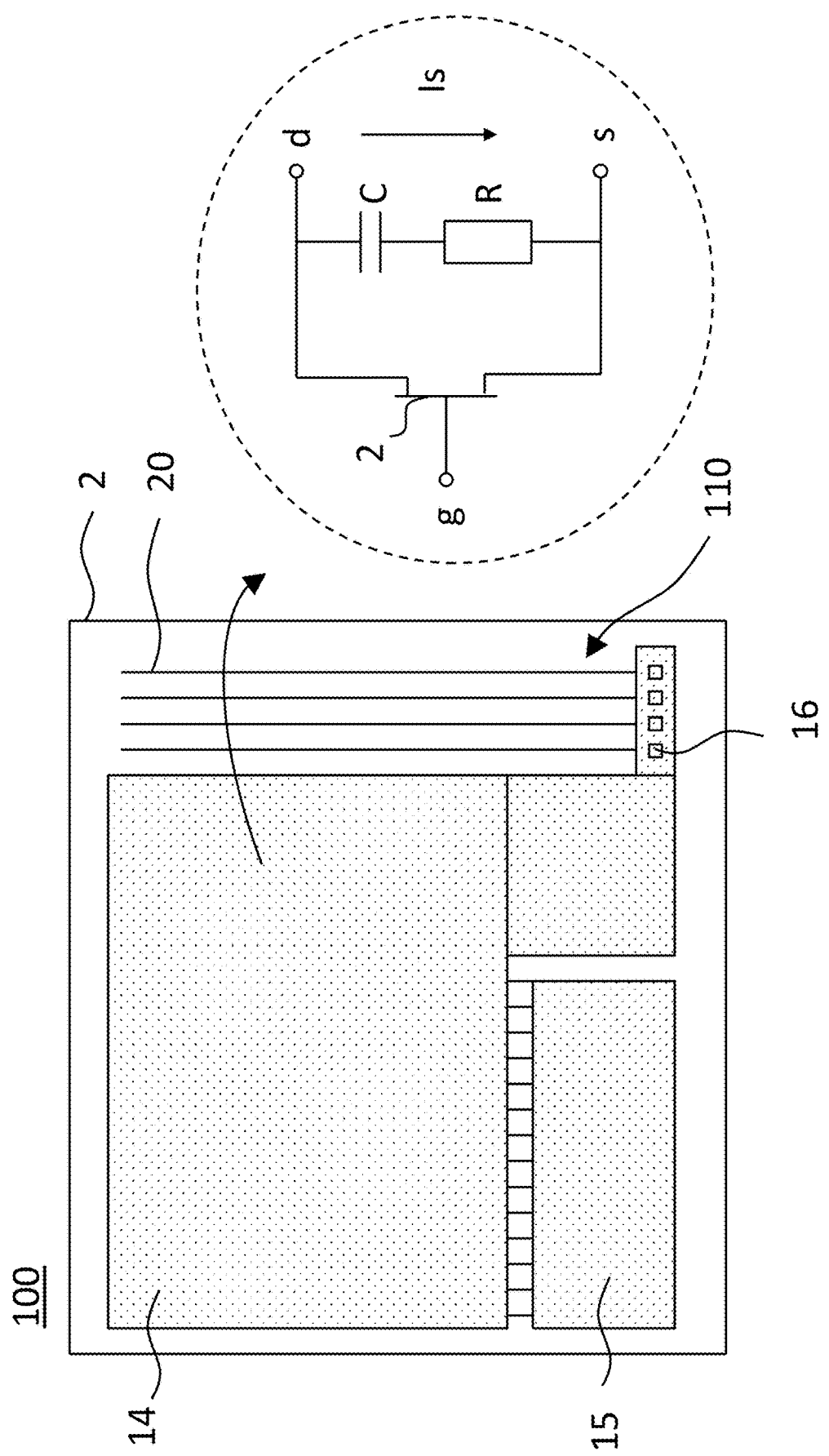
FIG. 2 illustrates an embodiment of a known switching device.

FIG. 1 illustrates an example of a known trench MOSFET 1 (left) and a known trench capacitor 20 (right). Furthermore, FIG. 2 illustrates an embodiment of a known switching device 100 in which trench MOSFET 1 and trench capacitor 20 are used.

Trench MOSFET 1 comprises a silicon semiconductor substrate 2 of a first charge type, and an epitaxial layer 3 of a first charge type arranged on semiconductor substrate 2. A backside of semiconductor substrate 2 is covered with a metal layer stack forming a backside terminal 4. A trench 5 is formed in epitaxial layer 3. Trench 5 is covered on an inside thereof with a gate oxide 6 and is filled with a polysilicon body 7.

A source region 8 of a first charge type and a body region 9 of a second charge type are further formed in epitaxial layer 3. Epitaxial layer 3 comprises a drift region 10 of the first charge type arranged in between body region 9 and substrate 2.

Typically, silicon substrate 2 and epitaxial layer 3 are n-type doped. Body region 9 typically corresponds to a p-well obtained by dopant implantation using p-type dopants. Source region 8 typically corresponds to an n-well obtained by dopant implantation using n-type dopants in the p-well corresponding to body region 9.

FIG. 1 illustrates a trench MOSFET 1 having a single unit cell. Typically, trench MOSFET 1 comprises a plurality of such unit cells arranged adjacent to each other. For example, the unit cell can be repeated in a lateral direction. In such configuration, trench MOSFET 1 comprises a parallel arrangement of a plurality of first trenches 5.

In FIG. 1, source regions 8 are contacted by a conductive layer 11 that is arranged below a dielectric layer 12. A contact 13, in the form of a via, connects conductive layer 11 to a first frontside terminal 14. As illustrated in FIG. 2, polysilicon body 7 is connected to a second frontside terminal 15 albeit at a different position along trench 5. Backside terminal 4 acts as the drain terminal d of trench MOSFET 1, and first and second frontside terminals 14, 15 as the source terminal s and gate terminal g, respectively.

Trench capacitor 20 shown on the right comprises much of the same components as trench MOSFET 1. Trench capacitor 20 is formed using polysilicon body 7 forming one terminal, and epitaxial layer 3 the other terminal, which terminals are separated by oxide 6. Polysilicon body 7 of trench capacitor 20 is connected to first frontside terminal 14 using a contact 16 through dielectric layer 12. The other terminal is connected, via the conductive epitaxial layer 3 and conductive semiconductor substrate 2, to backside terminal 4.

As shown in FIG. 2, much of trench MOSFET 1 is situated below frontside terminal 14. In addition, an RC snubber network 110 is provided in a peripheral area of the semiconductor die or it could be part of the area in which trench MOSFET 1 is realized. RC snubber network 110 comprises a plurality of trench capacitors 20. As shown in the dashed circle, RC snubber network 110 can be represented, in a first approximation, as a series connection of a resistance R and a capacitance C connected in between the drain and source of trench MOSFET 1. By optimizing the values for R and C, the transient response of trench MOSFET 1 can be optimized. Here, it is noted that the transient response corresponds to the drain-source voltage of the trench MOSFET 1 in response to low to high transition at the gate of trench MOSFET 1, or vice versa. In absence of the RC snubber network, high spike voltages may occur in addition to an under-damped oscillatory response.

Figure 3A:
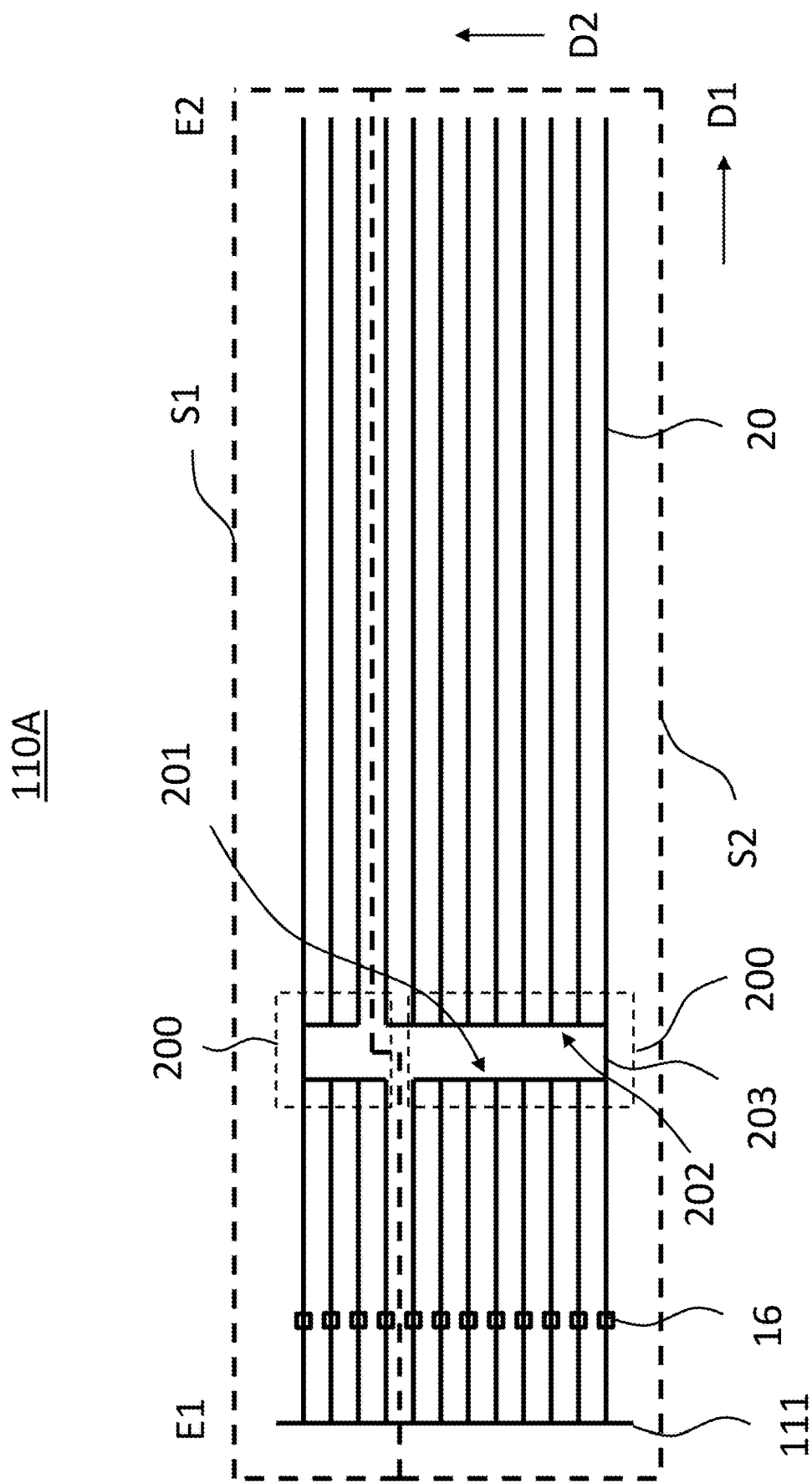
Figure 3B:
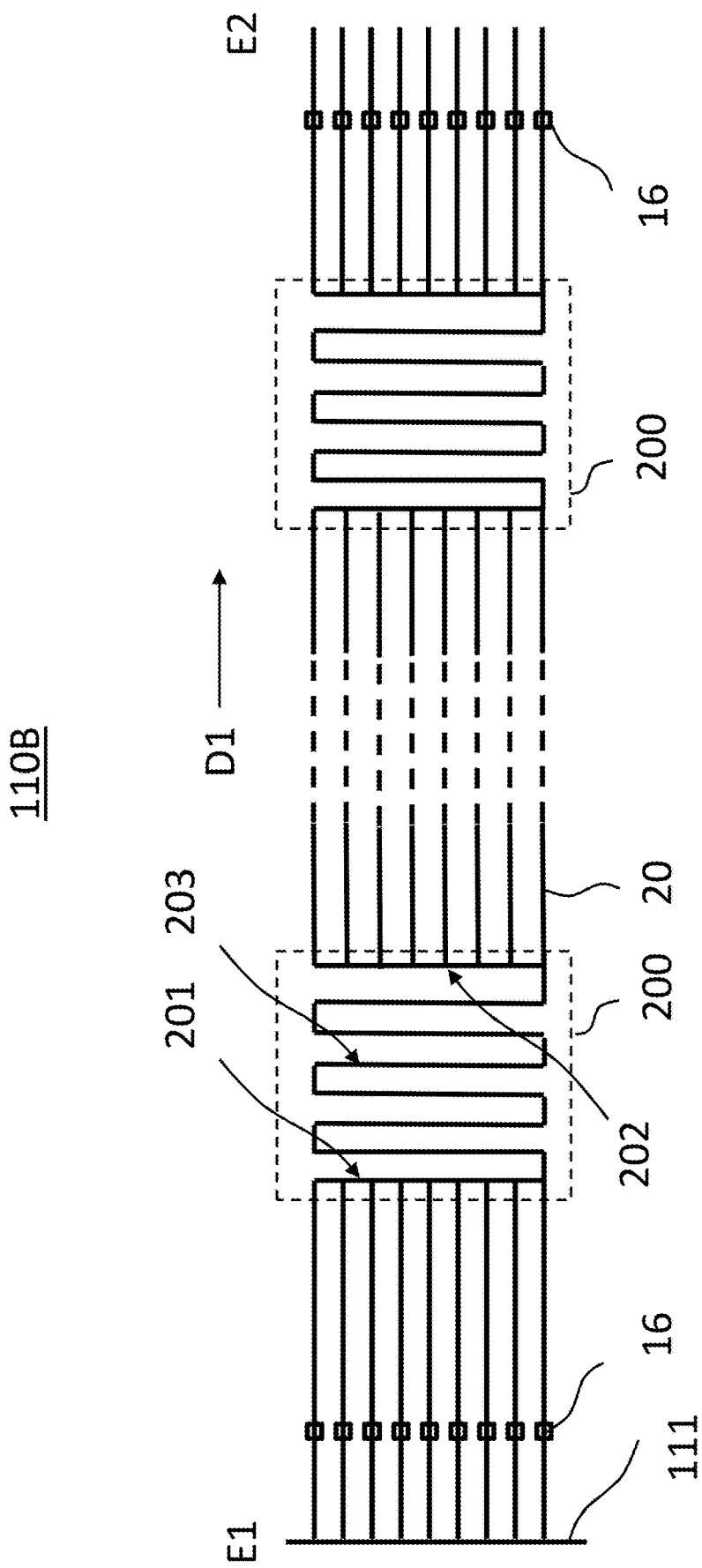

FIGS. 3A-3C illustrate examples of RC snubber networks in accordance with the present disclosure. In these figures, lines 20 indicate the polysilicon bodies 7 of trench capacitors 20.

In FIG. 3A, a first embodiment of an RC snubber network 110A in accordance with the present disclosure is shown. Network 110A comprises two segments S1, S2, wherein segment S1 comprises 4 trench capacitors 20 on the left, 3 trench capacitors 20 on the right, and a current concentrating segment 200. Segment S2 comprises 8 trench capacitors 20 on the left, 9 trench capacitors 20 on the right, and a current concentrating segment 200. Furthermore, trench capacitors 20 on the left are connected to first frontside terminal 14 using contacts 16.

Current concentrating segment 200 comprises a fan-in segment in the form of a trench capacitor 201, and a fan-out segment in the form of a trench capacitor 202. Trench capacitor 201 connects the 8 trench capacitors to the left of fan-in segment to trench capacitor 203. Similarly, trench capacitor 202 connects trench capacitor 203 to the 9 trench capacitors 20 to the right of the fan-out segment.

Trench capacitors 20 to the left and right of current concentrating segment 200 extend in parallel and along a first direction D1. Furthermore, trench capacitors 20 are equidistantly arranged in a second direction D2 perpendicular to first direction D1.

During a switching event of trench MOSFET 1, a snubber current will flow between backside terminal 4 and first frontside terminal 14 through RC snubber network 110A, 110B, 110C, and more in particular through contacts 16.

Due to the positioning of contacts 16 relative to edge E1 and current concentrating segment 200, more in particular that contacts 16 are arranged in between edge E1 and current concentrating segment 200 and in that both contacts 16 and current concentrating segment 200 are arranged close to edge E1, the major part of the snubbing current is forced to flow through current concentrating segment 200.

Current concentrating segment 200 forces the current to locally flow through a reduced number of trench capacitors 20. For example, instead of n trench capacitors of length l in parallel, a single trench capacitor of length n×l is used. Consequently, the ohmic losses associated with the snubber current can be increased while the effective capacitance can be kept substantially the same.

By varying the shape of current concentrating segment 200, the resistance and capacitance can be chosen such that the transient response of trench MOSFET 1 during a switching event can meet predetermined criteria.

In an exemplary design flow, a device simulation is performed of the RC snubber network. This simulation will output electrical data based on which an RC network with a predetermined amount of nodes can be computed. This RC network can then be used in an electrical simulation of the switching device to predict the transient response. If this response is not acceptable, the RC snubber network can be redesigned. More in particular, the current concentrating segment 200 can be re-designed. For example, the length and/or shape of trench capacitor 203 can be changed.

It should be noted that FIG. 2 is not true to scale. In practical embodiments, the distance between contacts 16 and edge E1 and the distance between current concentrating segment 200 and edge E1 is much smaller than the total length between edges E1 and E2.

At edge E1 and/or edge E2, the conductive tracks of trench capacitors 20 can be interconnected using a trench capacitor 20 that extends in second direction D2 and/or by a conductive bar 111 or the like.

The effective resistance of the RC snubber network is mostly determined by the length, thickness, and width of polysilicon bodies 7. Alternatively, polysilicon bodies 7 could be connected to conductive tracks having a similar shape to that shown in FIG. 3A.

In FIG. 3A, components 201, 202, and 203 are each trench capacitors. The trenches of these capacitors may be interconnected to form a contiguous trench. Alternatively, components 201, 202, and/or 203 can be realized as conductive tracks only, i.e. not being part of a trench capacitor.

FIGS. 3B and 3C illustrate alternative embodiments of current concentrating segment 200. In FIG. 3B, a current concentrating segment 200 is present on both sides of RC snubber network. Similar considerations with respect to the positioning of contacts 16 and current concentrating segment 200 as mentioned above apply to both sides. The dashed lines indicate that the trench capacitors in between the current concentrating segments 200 are much longer than illustrated in FIG. 3B.

Current concentrating segment 200 illustrated in FIG. 3C is rotated relative to current concentrating segment 200 in FIG. 3B. The embodiment shown in FIG. 3C allows a fine control over the length, and therefore resistance, of the trench capacitors of current concentrating segment 200 in direction D1. This length in the embodiment shown in FIG. 3B can only be increased in coarse steps defined by adding one full meander at a time.

Figure 4:
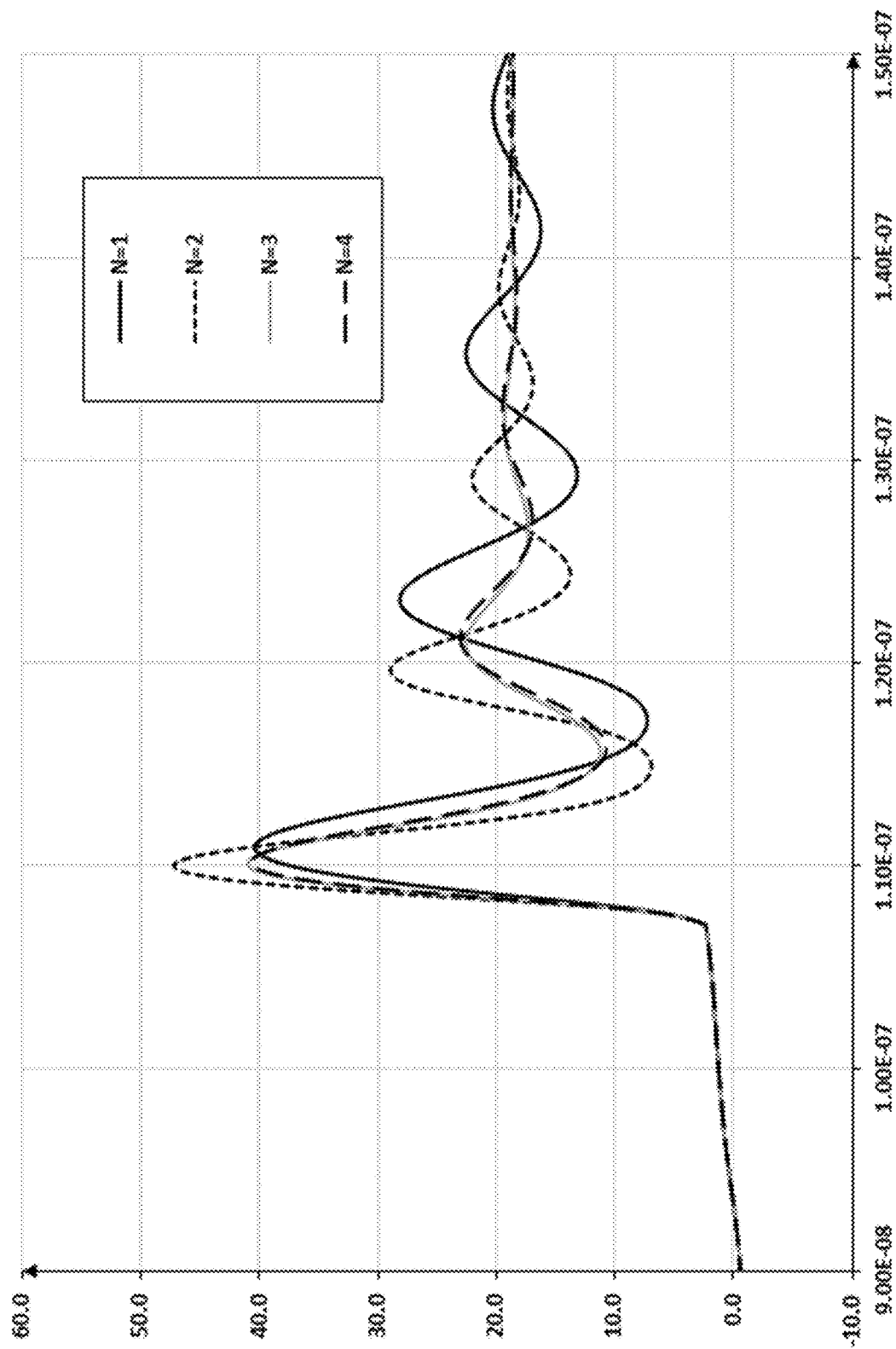
FIG. 4 illustrates a transient response of a switching device in accordance with the present disclosure.

FIG. 4 illustrates the drain-source voltage of trench MOSFET 1 as a function of time during a switching event for different configurations. MOSFET 1 comprises the RC snubber network of FIG. 3C arranged at both edges of the RC snubber network.

Here, N=1 relates to a configuration in which the various segments of the RC snubber network each comprise a pair of current concentration segments. These current concentration segments each comprise a fan-in segment that connects 5 trench capacitors to a single trench capacitor and a fan-out segment that connects this single trench capacitor to 5 trench capacitors. The single trench capacitor has no meandering shape.

N=2 relates to a configuration in which the various segments of the RC snubber network each comprise a pair of current concentration segments. These current concentration segments each comprise a fan-in segment that connects 35 trench capacitors to a single trench capacitor and a fan-out segment that connects this single trench capacitor to 35 trench capacitors. The single trench capacitor has no meandering shape.

N=3 relates to a configuration in which the RC snubber network has first and second segments. Each segment comprises a pair of current concentration segments. The current concentration segments of the first segment each comprise a fan-in segment that connects 15 trench capacitors to a single trench capacitor and a fan-out segment that connects this single trench capacitor to 15 trench capacitors. The single trench capacitor has no meandering shape. The current concentration segments of the second segment each comprise a fan-in segment that connects 20 trench capacitors to a single trench capacitor and a fan-out segment that connects this single trench capacitor to 20 trench capacitors. The single trench capacitor has no meandering shape.

N=4 relates to a configuration in which the various segments of the RC snubber network each comprise a pair of current concentration segments. These current concentration segments each comprise a fan-in segment that connects 5 trench capacitors to a single trench capacitor and a fan-out segment that connects this single trench capacitor to 5 trench capacitors. The single trench capacitor has a meandering shape.

As can be seen from the figure, the drain-source peak voltage and the ringing effect is the smallest for the N=3 and N=4 configurations. It further indicates that significant improvements can be realized by optimizing the RC snubber network and more in particular the current concentrating segment. In this respect, it is noted that in some embodiments, the capacitance of the RC snubber network is maximized, and based on this capacitance value, the resistance is optimized.

In the above, the present disclosure has been explained using detailed embodiments thereof. However, the present disclosure is not limited to these embodiments. Various modifications are possible without departing from the scope of the present disclosure which is defined by the appended claims and their equivalents.

What is claimed is:

1. A switching device, comprising:
a trench transistor integrated on a semiconductor substrate, the trench transistor having a control terminal, a first terminal, and a second terminal;
wherein the trench transistor is configured to control a current between the first and second terminals based on a control signal received at the control terminal;
an RC snubber network integrated on the semiconductor substrate and electrically connected between the first terminal and second terminal of the trench transistor;
wherein the RC snubber network is configured to guide a snubber current during switching of the switching device;
wherein the RC snubber network comprises a network of trench capacitors; and
wherein the RC snubber network comprises at least one current concentrating segment that is configured to locally force a major part of the snubber current passing through the trench capacitors to flow through a reduced number of trench capacitors to thereby increase Ohmic losses associated with the snubber current,
a segment connected on one side thereof to M trench capacitors and on another side thereof to of T trench capacitors; and/or
a segment connected on one side thereof to N trench capacitors and on another side thereof to T trench capacitors; and
wherein T<M, T<N, and wherein T>=1.

2. The switching device according to claim 1, wherein each trench capacitor has a respective conductive track forming one terminal of that trench capacitor and the semiconductor substrate forming another terminal of that trench capacitor.

3. The switching device according to claim 1, wherein the trench transistor is a trench MOSFET.

4. The switching device according to claim 1, wherein the trench transistor is formed using one or more trench etching steps; and
wherein the trenches of the RC snubber network have been formed using at least one of the one or more trench etching steps.

5. The switching device according to claim 1, wherein the semiconductor substrate is a silicon substrate;
wherein each trench capacitor comprises a trench formed in the silicon substrate and of which an inside is covered by an insulating layer, each trench capacitor further comprising a conductive layer arranged on the insulating layer, the conductive layer being electrically connected to and/or at least partially forming the conductive track of that trench capacitor;
wherein the insulating layer is silicon dioxide and/or silicon nitride; and/or
wherein the conductive layer is made from polysilicon; and/or
wherein the semiconductor substrate is conductive.

6. The switching device according to claim 2, wherein the current concentrating segment comprises:
a fan-in segment of the segment connected on one side thereof to the conductive tracks of M trench capacitors and on another side thereof to the conductive tracks of T trench capacitors; and/or
a fan-out segment of the segment connected on one side thereof to the conductive tracks of N trench capacitors and on another side thereof to the conductive tracks of the T trench capacitors.

7. The switching device according to claim 6, wherein the fan-in segment comprises a first trench capacitor among the network of trench capacitors of which the conductive track connects the conductive tracks of the M trench capacitors to the conductive tracks of the T trench capacitors; and/or
wherein the fan-out segment comprises a second trench capacitor among the network of trench capacitors of which the conductive track connects the conductive tracks of the N trench capacitors to the conductive tracks of the T trench capacitors.

8. The switching device according to claim 6, wherein the trenches of the M trench capacitors and the trenches of the N trench capacitors extend in a same direction; and
wherein the trenches of the M trench capacitors, the trenches of the N trench capacitors, and the trenches of the T trench capacitors extend in the same direction, or wherein the trenches of the T trench capacitors has/have a meandering shape.

9. The switching device according to claim 7, wherein the trenches of the M trench capacitors are connected to the trenches of the T trench capacitors through the trench of the first trench capacitor; and
wherein the trenches of the N trench capacitors are connected to the trenches of the T trench capacitors through the trench of the second trench capacitor, thereby forming a contiguous trench.

10. The switching device according to claim 9, wherein the network of trench capacitors has an elongated shape, in the same direction, from a first end to a second end, and wherein at least the trench capacitors in the network of trench capacitors other than the trench capacitors of the current concentrating segment extend in the same direction.

11. The switching device according to claim 9, wherein the network of trench capacitors comprises a plurality of segments that are adjacently arranged in a direction perpendicular to the same direction, and wherein each segment comprises one or more of the current concentrating segment.

12. The switching device according to claim 10, wherein at least the trench capacitors in the network of trench capacitors other than the trench capacitors of the current concentrating segment are equidistantly arranged.

13. The switching device according to claim 10, wherein the semiconductor substrate has frontside and a backside, wherein the trench transistor is integrated on the semiconductor substrate at the frontside thereof, the trench transistor having a frontside terminal and a backside terminal arranged at the frontside and backside of the semiconductor substrate, respectively, wherein one of the frontside terminal and backside terminal forms and/or is electrically connected to the first terminal of the trench transistor and wherein the other of the frontside terminal and backside terminal forms and/or is electrically connected to the second terminal of the trench transistor, and wherein the frontside terminal is formed by a conductive layer or plate; and
wherein the RC snubber network further comprises a plurality of contacts that each connect a respective conductive track to the frontside terminal for connecting the RC snubber network to the frontside terminal.

14. The switching device according to claim 13, wherein the at least one current concentrating segment comprises a first current concentrating segment arranged closer to the first end than to the second end, and wherein the contacts for contacting the conductive tracks of the trench capacitors are arranged in between the first end and the first current concentrating element.

15. The switching device according to claim 14, wherein the at least one current concentrating segment comprises a second current concentrating segment arranged closer to the second end than to the first end, and wherein the contacts for contacting the conductive tracks of the trench capacitors are arranged in between the second end and the second current concentrating element.

16. The switching device according to claim 15, wherein the network of trench capacitors comprises a plurality of segments that are adjacently arranged in a direction perpendicular to the same direction, and wherein each segment comprises one or more of the current concentrating segment.

17. An RC snubber network for a switching device as defined in claim 1, the switching device comprising a trench transistor integrated on a semiconductor substrate, the trench transistor having a control terminal, a first terminal, and a second terminal;
wherein the trench transistor is configured to control a current between the first and second terminals based on a control signal received at the control terminal;
wherein the RC snubber network is integrated on the semiconductor substrate and is electrically connected in between the first terminal and the second terminal of the trench transistor;
wherein the RC snubber network is configured to guide a snubber current during switching of the switching device;
wherein the RC snubber network comprises a network of trench capacitors; and
wherein the RC snubber network comprises a current concentrating segment that is configured to locally force a major part of the snubber current passing through the trench capacitors to flow through a reduced number of trench capacitors to thereby increase Ohmic losses associated with the snubber current.

18. The switching device according to claim 17, wherein the trench transistor is a trench MOSFET.

* * * * *